US007026260B2

(12) United States Patent
Shimizu

(10) Patent No.: US 7,026,260 B2
(45) Date of Patent: Apr. 11, 2006

(54) METHOD OF MANUFACTURING SEMICONDUCTOR DEVICE USING THERMAL TREATMENT THAT FEATURES LOWER SPEED WAFER ROTATION AT LOW TEMPERATURES AND HIGHER SPEED WAFER ROTATION AT HIGH TEMPERATURES

(75) Inventor: Mikio Shimizu, Higashiibaraki (JP)

(73) Assignee: Trecenti Technologies, Inc., Hitachinaka (JP)

( * ) Notice: Subject to any disclaimer, the term of this patent is extended or adjusted under 35 U.S.C. 154(b) by 187 days.

(21) Appl. No.: 10/755,395

(22) Filed: Jan. 13, 2004

(65) Prior Publication Data

US 2004/0152343 A1    Aug. 5, 2004

(30) Foreign Application Priority Data

Jan. 31, 2003    (JP)    ............................. 2003-023151

(51) Int. Cl.
   *H01L 21/477*    (2006.01)
(52) U.S. Cl. ...................................... 438/795; 438/782
(58) Field of Classification Search ................. 438/782
   See application file for complete search history.

(56) References Cited

U.S. PATENT DOCUMENTS

| 5,654,904 A | * | 8/1997 | Thakur | ....................... 702/137 |
| 6,130,415 A | * | 10/2000 | Knoot | ........................ 219/502 |
| 6,449,428 B1 | * | 9/2002 | Aschner et al. | ............. 392/418 |
| 6,528,364 B1 | * | 3/2003 | Thakur | ....................... 438/239 |
| 6,828,234 B1 | * | 12/2004 | Tam et al. | .................. 438/663 |
| 2002/0111043 A1 | * | 8/2002 | Mahawili | .................... 438/795 |
| 2003/0203517 A1 | * | 10/2003 | Suzuki et al. | ................. 438/14 |

FOREIGN PATENT DOCUMENTS

JP    6-260426    9/1994

* cited by examiner

*Primary Examiner*—Stephen W. Smoot
(74) *Attorney, Agent, or Firm*—Antonelli, Terry, Stout and Kraus, LLP.

(57) ABSTRACT

A technique capable of preventing breakage of a semiconductor wafer in a single-wafer RTP apparatus is provided. Open-loop control is made in a temperature rising process, in which the temperature of the semiconductor wafer is 500° C. or lower, and a revolution speed of the semiconductor wafer is relatively reduced to 100 rpm or lower even if the bowing of the semiconductor wafer occurs. Therefore, a centrifugal force exerted on the semiconductor wafer is reduced, whereby it becomes possible to prevent the semiconductor wafer from dropping from a stage of the single-wafer RTP apparatus. Additionally, closed-loop control is made in the temperature rising process, in which the temperature of the semiconductor wafer is higher than 500° C., and in a main treatment process, and further the revolution speed of the semiconductor wafer is relatively increased. By so doing, the almost uniform in-plane temperature of the semiconductor wafer can be achieved and the bowing of the semiconductor wafer can be prevented.

17 Claims, 12 Drawing Sheets

FIG. 3
FIG. 3A START ROTATION OF SEMICONDUCTOR WAFER
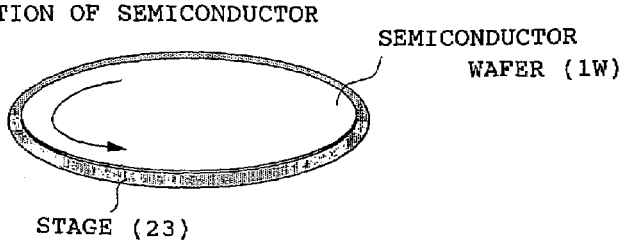
FIG. 3B TEMPERATURE RISING PROCESS AT 500°C OR LOWER (NONUNIFORM IN-PLANE TEMPERATURE OF SEMICONDUCTOR WAFER)
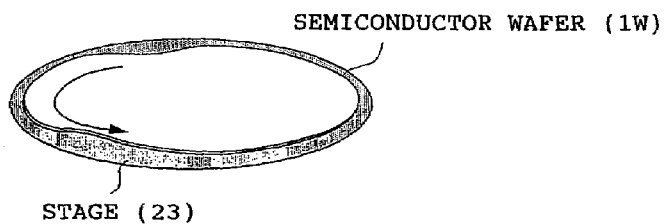
FIG. 3C TEMPERATURE RISING PROCESS ABOVE 500°C AND MAIN TREATMENT PROCESS (UNIFORM IN-PLANE TEMPERATURE OF SEMICONDUCTOR WAFER)
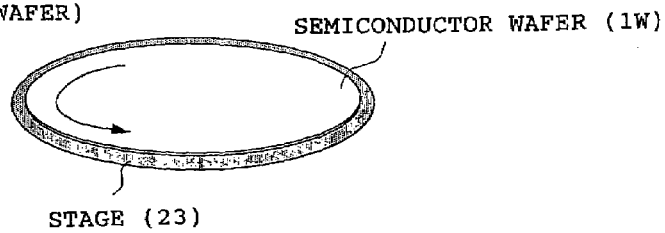

METHOD OF MANUFACTURING SEMICONDUCTOR DEVICE USING THERMAL TREATMENT THAT FEATURES LOWER SPEED WAFER ROTATION AT LOW TEMPERATURES AND HIGHER SPEED WAFER ROTATION AT HIGH TEMPERATURES

BACKGROUND OF THE INVENTION

The present invention relates to a technique for manufacturing a semiconductor device and, particularly, to a technique effectively applied to a thermal treatment process of a semiconductor wafer using a RTP (Rapid Thermal Processing).

With scaling-down of the minimum design rule of the semiconductor device, formation of a shallow junction with a depth of, for example, 0.1 µm or less has been demanded. The shallow junction can be achieved by ion implantation of an impurity into a shallow portion of a substrate with using lower acceleration energy. However, after the ion implantation, it is necessary to perform a thermal treatment to the substrate, in order to rearrange the ion-implanted impurity to grid points and activate it or in order to repair the crystal damage caused by the ion implantation.

Therefore, the shallow junction is formed by the ion implantation and the thermal treatment using a single-wafer RTP apparatus with a temperature rising rate of 10° C. or more per second, instead of a batch-type thermal treatment apparatus in which the temperature is increased and decreased relatively slowly. At present, the thermal treatment using the single-wafer RTP apparatus is used also in processes other than the above-mentioned process for forming the shallow junction, and it is expected that such a thermal treatment will be used in various situations in the manufacturing process of the semiconductor device in the future.

In the single-wafer RTP apparatus, a lot of ideas are provided for the method and the apparatus of the thermal treatment to achieve the uniformity in the in-plane temperature of the semiconductor wafer. For example, the method and the apparatus as follows are disclosed (e.g., Patent Document 1). That is, temperature measurement points by a radiation thermometer are set at a plurality of different points where are disposed in an outer peripheral portion of the wafer and in a portion a 70% or more radius away from the wafer, and, simultaneously, the heating is such that the difference in temperature among the plurality of measurement points is controlled within 5° C. in the temperature rising process and during the time when the high temperature is maintained.

[Patent Document 1]
Japanese Patent Laid-Open No. 6-260426

SUMMARY OF THE INVENTION

The inventors of the present invention have examined, by using the single-wafer RTP apparatus provided with a halogen lamp as a heat source, a method of performing a thermal treatment including: a temperature rising process of a semiconductor wafer with a diameter of 300 mm (hereinafter, refereed to as "300 mm diameter semiconductor wafer"); a main treatment process for maintaining the predetermined final temperature for a predetermined time; and a temperature falling process.

In a temperature range of the semiconductor wafer at 400° C. or lower, light absorption of silicon single crystal that constitutes the semiconductor wafer becomes relatively weak in a wavelength range of approximately 1 to 5 µm. Therefore, there arises the problem that the radiation thermometer with a detection wavelength of approximately 0.8 to 2.5 µm detects disturbance light, for example, halogen lamp light with the wavelength distributed in the infrared range having a peak at approximately 1 µm, but the temperature of the semiconductor wafer cannot be monitored correctly.

For its solution, in the temperature rising process in which the temperature of the semiconductor wafer is 500° C. or lower, so-called open-loop control is adopted in which the lamp power for heating the semiconductor wafer is set in advance to heat the semiconductor wafer. Thereafter, when the temperature of the semiconductor wafer reaches 500° C., the open-loop control is switched to closed-loop control in which the temperature of the semiconductor wafer is monitored by the use of the radiation thermometer and the monitored results are fed back to the lamp power to control the temperature of the semiconductor wafer and, in this state, the temperature rising process above 500° C. and the main treatment process are performed.

However, since the semiconductor wafer is rotated during the thermal treatment so as to achieve the uniformity in the in-plane temperature of the semiconductor wafer, when bowing of the semiconductor wafer occurs, the semiconductor wafer is dropped from the stage of the apparatus during the thermal treatment and, consequently, the semiconductor wafer is broken in some cases.

The in-plane temperature of the 300 nm diameter semiconductor wafer frequency becomes nonuniform during the temperature rising and the absolute value of an amount of bowing of the 300 nm diameter semiconductor wafer is larger than that of the semiconductor wafer with a diameter of 200 nm or smaller. Additionally, the in-plane temperature of the semiconductor wafer easily becomes nonuniform in the temperature rising process at a temperature of 500° C. or lower at which the open-loop control is made, in comparison to the temperature rising process and the main treatment process above 500° C. at which the closed-loop control is made.

Therefore, in the case where the thermal treatment is performed to the 300 nm diameter semiconductor wafer, particularly, in the temperature rising process at a temperature of 500° C. or lower at which the open-loop control is made, the problem of breakage of the semiconductor wafer due to the bowing thereof becomes prominent.

In the temperature rising process at a temperature of 500° C. or lower, although it may be possible to set the lamp power of the halogen lamp optimum for each of the types and processes of the semiconductor product, the setting requires an enormous amount of labor. Also, when the semiconductor wafers with different properties such as the thickness of a film deposited on the semiconductor wafer or the concentration of the ion-implanted impurity are mixed, the in-plane temperature becomes nonuniform due to the difference in the absorption of the halogen lamp light and, consequently, the bowing of the semiconductor wafer is caused.

An object of the present invention is to provide a technique capable of preventing the breakage of the semiconductor wafer in the single-wafer RTP apparatus.

The above and other objects and novel characteristics of the present invention will be apparent from the description of this specification and the accompanying drawings.

The typical ones of the inventions disclosed in this application will be briefly described as follows.

The present invention is a method of manufacturing a semiconductor device, in which a thermal treatment, including a temperature rising process, a main treatment process in which a predetermined final temperature is maintained for a predetermined time, and a temperature falling process, is performed to a semiconductor wafer by using a single-wafer apparatus, the method comprising the steps of: rotating said semiconductor wafer at a relatively low revolution speed in a process for making open-loop control; and rotating said semiconductor wafer at a relatively high revolution speed in a process for making closed-loop control.

The present invention is a method of manufacturing a semiconductor device, in which a thermal treatment, including a treatment rising process, a main treatment process in which a predetermined final temperature is maintained for a predetermined time, and a temperature falling process, is performed to a semiconductor wafer by using a single-wafer apparatus, the method comprising the steps of: rotating said semiconductor wafer at a relatively low revolution speed in said temperature rising process in which the temperature of said semiconductor wafer is 500° C. or lower; and rotating said semiconductor wafer at a relatively high revolution speed in said temperature rising process in which the temperature of said semiconductor wafer is higher than 500° C. and in said main treatment process.

BRIEF DESCRIPTION OF THE DRAWINGS

FIG. 3A is a schematic diagram showing the bowing of a semiconductor wafer using the single-wafer RTP apparatus according to the first embodiment of the present invention.

FIG. 3B is a schematic diagram showing the bowing of the semiconductor wafer in a temperature rising process of a thermal treatment using the single-wafer RTP apparatus according to the first embodiment of the present invention.

FIG. 3C is a schematic diagram showing the bowing of the semiconductor wafer in a main treatment process of a thermal treatment using the single-wafer RTP apparatus according to the first embodiment of the present invention.

DESCRIPTIONS OF THE PREFERRED EMBODIMENTS

Hereinafter, embodiments of the present invention will be described in detail with reference to the accompanying drawings. Note that members having the same function are denoted by the same reference symbol throughout all the drawings for describing the embodiments and the repetitive description thereof will be omitted.

(First Embodiment)

Figure 1:
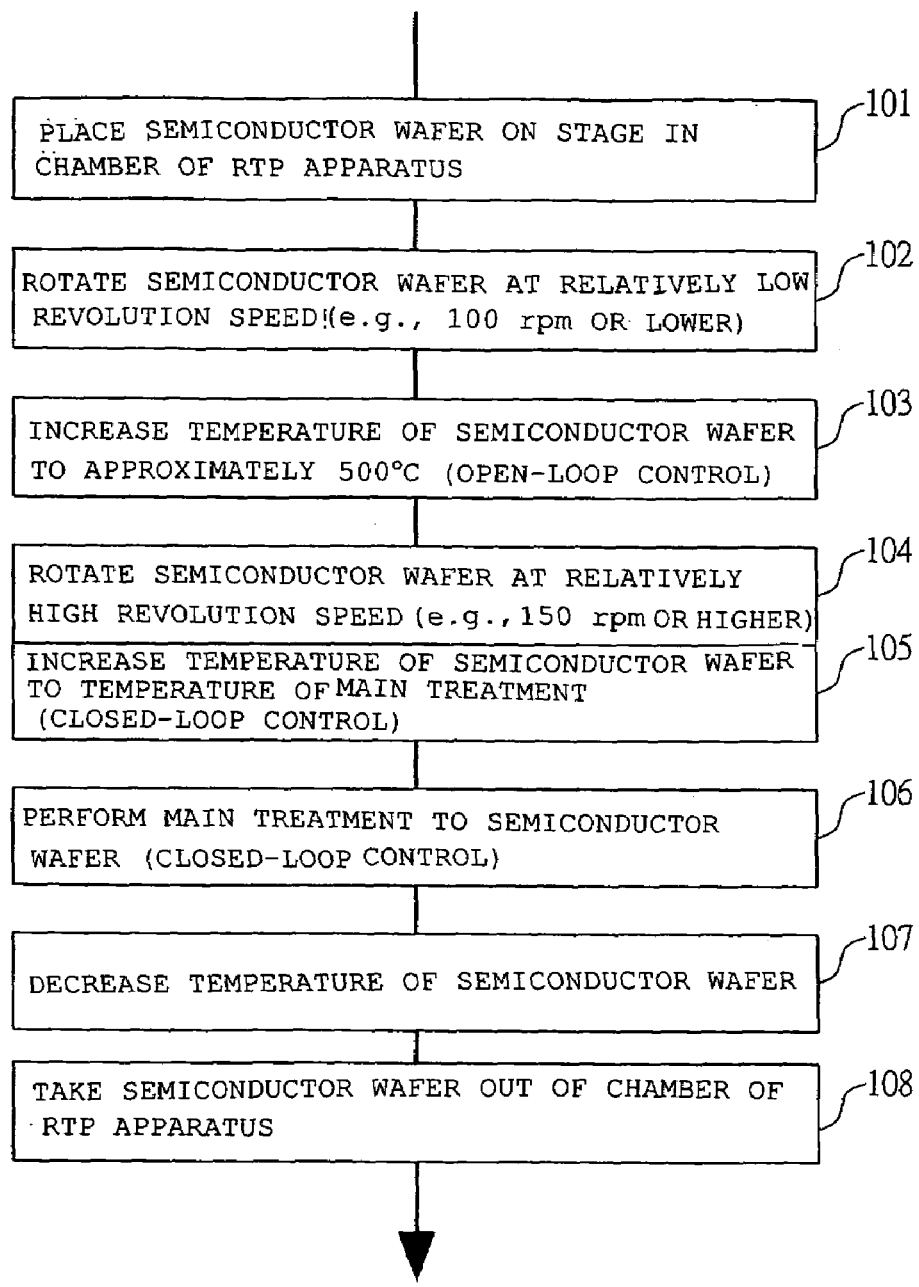
FIG. 1 is a flow diagram showing a thermal treatment process using a single-wafer RTP apparatus according to a first embodiment of the present invention.
Figure 2:
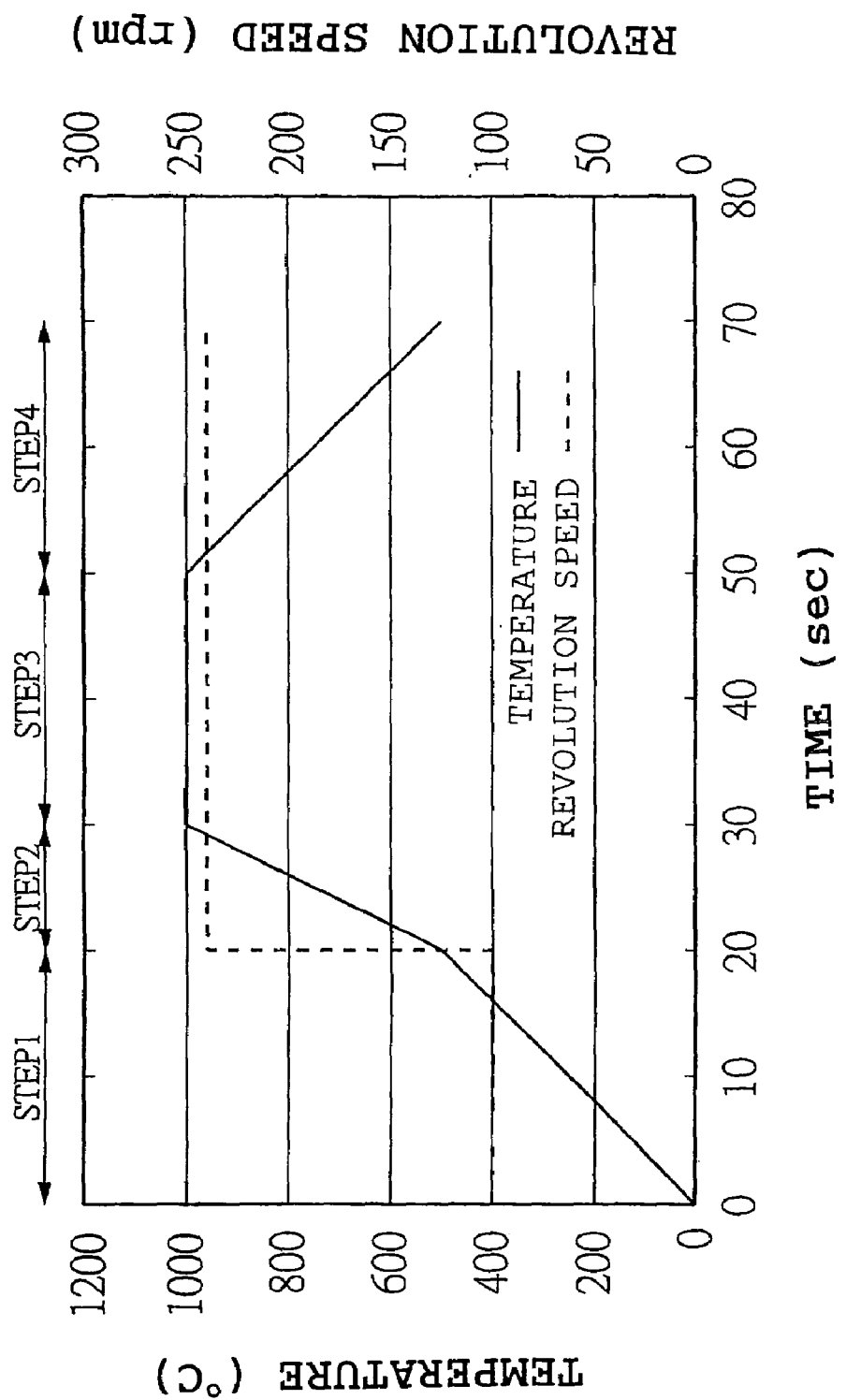
FIG. 2 is a graph showing a time-change in temperature and revolution speed of a semiconductor wafer during a thermal treatment using the single-wafer RTP apparatus according to the first embodiment of the present invention.

A method of a thermal treatment, using a single-wafer RTP apparatus according to a first embodiment, will be described with reference to FIGS. 1 to 3. FIG. 1 is a flow diagram showing a thermal treatment process; FIG. 2 is a graph showing a time-change in temperature and revolution speed of a semiconductor wafer during the thermal treatment; and FIGS. 3A to 3C are schematic diagrams showing bowing of the semiconductor wafer in a temperature rising process and a main treatment process of the thermal treatment. In this first embodiment, the thermal treatment comprises: a temperature rising process; a main treatment process in which the predetermined temperature is maintained for a predetermined time; and a temperature falling process, wherein the temperature of a main treatment is set at 1000° C. and the treatment time thereof is set at 20 seconds.

Though not shown, the single-wafer RTP apparatus is provided with a halogen lamp, which is used as a heat source with wavelength distributed in an infrared range having a peak at approximately 1 μm, and the temperature of a semiconductor wafer 1W can be controlled by adjusting setting conditions of lamp power of the halogen lamp. Additionally, the single-wafer RTP apparatus has a function to rotate the semiconductor wafer 1W during the thermal treatment in order to improve uniformity of the in-plane temperature of the semiconductor wafer 1W.

First, the semiconductor wafer 1W is inserted into a chamber of the single-wafer RTP apparatus and placed on a stage 23 (step 101 in FIG. 1). Then, the semiconductor wafer 1W is rotated at a relatively low revolution speed, for example, 100 rpm or lower (100 rpm in FIG. 2) (step 102 in FIG. 1). At this time, as shown in FIG. 3A, bowing of the semiconductor wafer 1W does not occur. Next, the temperature of the semiconductor wafer 1W is increased up to approximately 500° C. by open-loop control, for example, at a temperature rising rate of approximately 25° C./sec (step 103 in FIG. 1 and "STEP 1," in FIG. 2).

In the temperature rising process in which the temperature of the semiconductor wafer 1W is 500° C. or lower, the radiation thermometer detects disturbance light such as halogen lamp light and thereby the temperature of the semiconductor wafer 1W cannot be monitored correctly. Therefore, there is used the open-loop control of previously setting the lamp power of the halogen lamp and heating the semiconductor wafer 1W in accordance with the lamp power. Accordingly, the difference in the in-plane temperature (the most difference in the temperatures measured by the radiation thermometer) occurs frequently. However, by relatively reducing the revolution speed of the semiconductor wafer 1W, a centrifugal force exerted on the semiconductor wafer 1W is reduced even if the bowing of the semiconductor wafer 1W occurs as shown in FIG. 3B. Consequently, since the temperature rising process at 500° C. or lower is finished without dropping the semiconductor wafer 1W from the stage 23, the breakage of the semiconductor wafer 1W can be prevented.

Thereafter, at the time when the temperature of the semiconductor wafer 1W reaches 500° C., the semiconductor wafer 1W is rotated at a relatively high revolution speed of, for example, 150 rpm or higher (240 rpm in FIG. 2)(step 104 in FIG. 1) and, simultaneously, the open-loop control is switched to closed-loop control to further increase the temperature of the semiconductor wafer 1W up to 1000° C. at which a main treatment is performed (step 105 in FIG. 1 and "STEP 2" in FIG. 2). Subsequently, the main treatment for 20 seconds at 1000° C. is performed to the semiconductor wafer 1W (step 106 in FIG. 1 and "STEP 3" in FIG. 2).

In the temperature rising process in which the temperature of the semiconductor wafer 1W is higher than 500° C. and in the main treatment process performed at 1000° C., there is used the closed-loop control in which the temperature of the semiconductor wafer 1W is measured by the use of the radiation thermometer and the measured results are fed back to the lamp power of the halogen lamp and thereby the temperature of the semiconductor wafer 1W is controlled.

Furthermore, since the almost uniform in-plane temperature of the semiconductor wafer 1W can be achieved by making relatively high the revolution speed of the semiconductor wafer 1W, the bowing of the semiconductor wafer 1W is hardly caused as shown in FIG. 3C. Consequently, the semiconductor wafer 1W is not dropped from the stage 23 and the breakage of the semiconductor wafer 1W can be prevented.

Next, after the predetermined main treatment is performed to the semiconductor wafer 1W, while the semiconductor wafer 1W is being rotated at 150 rpm or higher (240 rpm in FIG. 2), the lamp power of the halogen lamp is turned off and the temperature of the semiconductor wafer 1W is decreased (step 107 in FIG. 1 and "STEP 4" in FIG. 2). When the temperature of the semiconductor wafer 1W is reduced to, for example, approximately 150 to 200° C., the rotation of the semiconductor wafer 1W is stopped and the semiconductor wafer 1W is taken out of the chamber of the single-wafer RTP apparatus.

Since the centrifugal force during the rotation of the semiconductor wafer 1W is changed depending on the diameter of the semiconductor wafer 1W, the revolution speed of the semiconductor wafer 1W is determined depending on the diameter of the semiconductor wafer 1W. Table 1 collectively shows the revolution speed of the semiconductor wafers 1W with a diameter of 200 mm or smaller and that with a diameter of 300 mm or larger.

TABLE 1

| TEMPERATURE OF SEMICONDUCTOR WAFER | DIAMETER OF SEMICONDUCTOR WAFER | |
|---|---|---|
| | Φ 200 mm OR SMALLER | Φ 300 mm OR LARGER |
| TEMPERATURE AT 500° C. OR LOWER | 100 rpm OR LOWER | 100 rpm OR LOWER |
| TEMPERATURE HIGHER THAN 500° C. | 150 TO 250 rpm | 200 TO 300 rpm |

It is preferable that: the revolution speed at 500° C. or lower is 100 rpm or smaller and that above 500° C. is 150 to 250 rpm in the case where the semiconductor wafer 1W has a diameter of 200 mm or smaller; and the revolution speed at 500° C. or lower is 100 rpm or smaller and that above 500° C. is 200 to 300 rpm in the case where the semiconductor wafer 1W has a diameter of 300 mm or larger.

Next, an example in which the present invention is applied to a manufacturing method for a CMOS (Complementary Metal Oxide Semiconductor) device will be described with reference to the sectional views showing the principal part of the semiconductor substrate in FIGS. 4 to 8.

Figure 4:
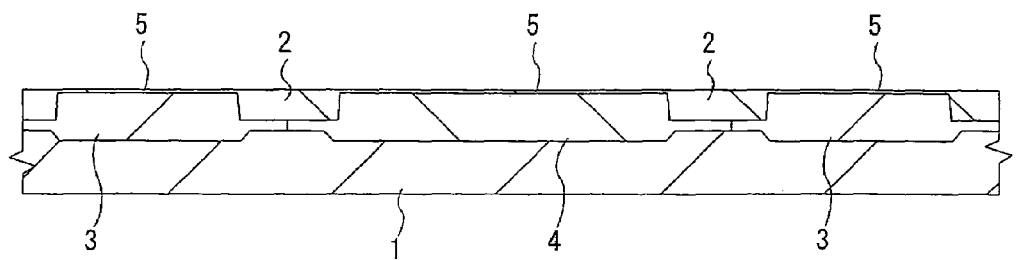
FIG. 4 is a sectional view showing a principal part of a semiconductor substrate, which illustrates, in step order, an example of a manufacturing method of a CMOS device according to the first embodiment of the present invention.

First, as shown in FIG. 4, a semiconductor substrate 1 made of, for example, p type single crystal silicon is prepared. The semiconductor substrate 1 is a semiconductor wafer processed like a thin circular plate with a diameter of, for example, 300 mm. Next, after device isolation trenches are formed in device isolation regions of the semiconductor substrate 1, a silicon oxide film deposited on the semiconductor substrate 1 by a CVD (Chemical Vapor Deposition)

is polished by an etch back or CMP (Chemical Mechanical Polishing) method to leave the silicon oxide film in the device isolation trenches. In this manner, device isolations 2 are formed.

Next, impurities are ion-implanted into the semiconductor substrate 1 with using a resist pattern as a mask to form p wells 3 and n wells 4. An impurity with p type conductivity such as boron is ion-implanted into the p well 3, and an impurity with n type conductivity such as phosphorus is ion-implanted into the n well 4. Thereafter, an impurity for controlling a threshold value of a MISFET (Metal Insulator Semiconductor Field Effect Transistor) may be ion-implanted into each well region.

Next, an approximately 2 nm thick silicon oxide film to be a gate insulator 5 is formed over a surface of the semiconductor substrate 1 by the use of the single-wafer RTP apparatus.

First, the semiconductor substrate 1 is inserted into the chamber of the single-wafer RTP apparatus (not shown) and is placed on a stage. Thereafter, the temperature of the semiconductor substrate 1 is increased up to approximately 500° C., by using the open-loop control in which the revolution speed of the semiconductor substrate 1 is set at 100 rpm. At the time when the temperature of the semiconductor substrate 1 reaches approximately 500° C., the revolution speed of the semiconductor substrate 1 is increased up to 240 rpm and, simultaneously, the open-loop control is switched to the closed-loop control to further increase the temperature of the semiconductor substrate 1 up to 900° C. Then, a thermal oxidation treatment is performed to the semiconductor substrate 1 for a predetermined time at a temperature of 900° C. Thereafter, the temperature of the semiconductor substrate 1 is decreased and the semiconductor substrate 1 is taken out from the chamber of the single-wafer RTP apparatus.

Figure 5:
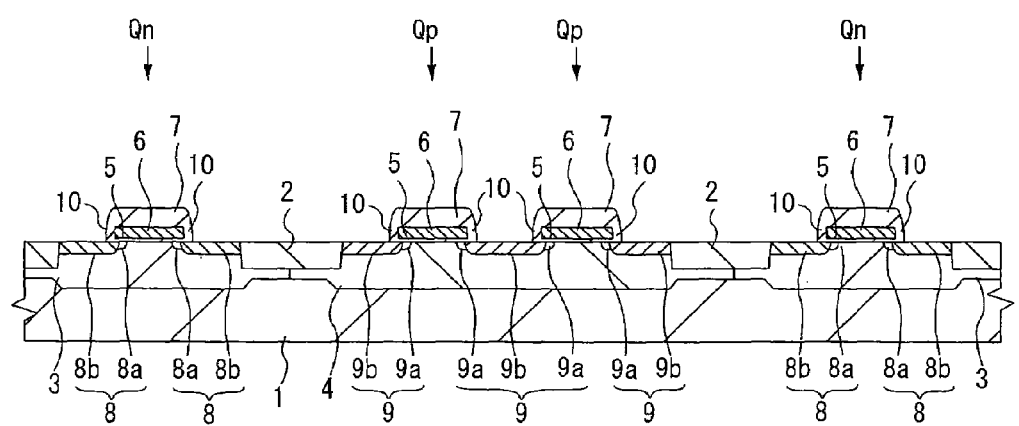
FIG. 5 is a sectional view showing a principal part of a semiconductor substrate, which illustrates, in step order, an example of a manufacturing method of a CMOS device according to the first embodiment of the present invention.

Next, as shown in FIG. 5, after a polycrystalline silicon film and a silicon oxide film is sequentially deposited to form a laminated film, the laminated film is etched with using a resist pattern as a mask, whereby gate electrodes 6 made of the polycrystalline silicon film and cap insulators 7 made of the silicon oxide film are formed.

Next, an impurity with n type conductivity, for example, arsenic is ion-implanted into the p well 3 to form n type extension regions 8a on both sides of the gate electrode 6 on the p well 3. The n type extension region 8a is formed in a self-alignment manner with respect to the gate electrode 6. Similarly, an impurity with p type conductivity, for example, boron fluoride is ion-implanted into the n well 4 to form p type extension regions 9a on both sides of the gate electrode 6 on the n well 4. The p type extension region 9a is formed in a self-alignment manner with respect to the gate electrode 6.

Thereafter, after a silicon oxide film is deposited over the semiconductor substrate 1 by the CVD method, the anisotropic etching is performed to the silicon oxide film and thereby sidewall spacers 10 are formed on sidewalls of the gate electrode 6.

Next, an impurity with n type conductivity, for example, arsenic is ion-implanted into the p well 3 to form n type extension regions 8b on both sides of the gate electrode 6 on the p well 3. The n type extension region 8b is formed-in a self-alignment manner with respect to the gate electrode 6 and the sidewall spacer 10, and the n type semiconductor regions 8, each composed of the n type extension region 8a and the n type extension region 8b, function as a source and drain of an n channel MISFET Qn.

Similarly, an impurity with p type conductivity, for example, boron fluoride is ion-implanted into the n well 4 to form p type extension regions 9b on both sides of the gate electrode 6 on the n well 4. The p type extension region 9b is formed in a self-alignment manner with respect to the gate electrode 6 and the sidewall spacer 10, and the p type semiconductor regions 9, each composed of the p type extension region 9a and the p type extension region 9b, function as a source and drain of a p channel MISFET Qp.

Next, the thermal treatment for activating the impurities ion-implanted into the semiconductor substrate 1 is performed to the semiconductor substrate 1 by the use of the single-wafer RTP apparatus.

First, the semiconductor substrate 1 is inserted into the chamber of the single-wafer RTP apparatus and is placed on the stage. Thereafter, the temperature of the semiconductor substrate 1 is increased up to approximately 500° C. by using the open-loop control in which the revolution speed of the semiconductor substrate 1 is set at 100 rpm. At the time when the temperature of the semiconductor substrate 1 reaches approximately 500° C., the revolution speed of the semiconductor substrate 1 is set at 240 rpm and, simultaneously, the open-loop control is switched to the closed-loop control to further increase the temperature of the semiconductor substrate 1 up to 1000° C. Then, the thermal treatment is performed to the semiconductor substrate 1 for a predetermined time at a temperature of 1000° C. Thereafter, the temperature of the semiconductor substrate 1 is decreased and taken out from the chamber of the single-wafer RTP apparatus.

Figure 6:
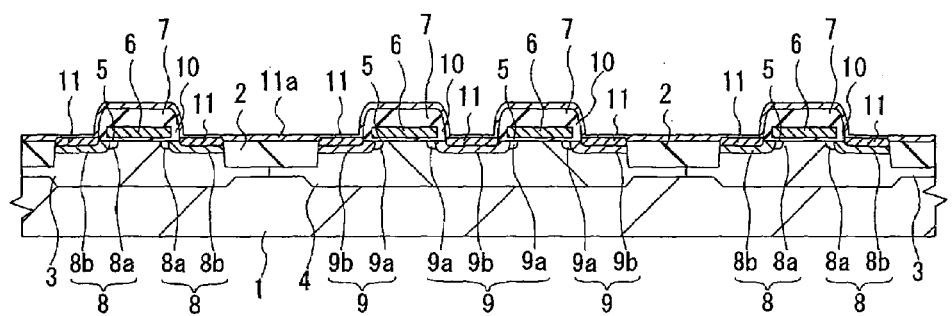
FIG. 6 is a sectional view showing a principal part of a semiconductor substrate, which illustrates, in step order, an example of a manufacturing method of a CMOS device according to the first embodiment of the present invention.

Next, as shown in FIG. 6, a cobalt film 11a with a thickness of approximately 10 to 20 nm is deposited over the semiconductor substrate 1 by, for example, a sputtering method. Subsequently, the thermal treatment is performed to the semiconductor substrate 1 by the use of the single-wafer RTP apparatus. By the thermal treatment, a silicide layer 11 with a thickness of approximately 30 nm is selectively formed on the surfaces of the n type semiconductor regions 8 constituting the source and drain of the n channel MISFET Qn and on the surfaces of the p type semiconductor regions 9 constituting the source and drain of the p channel MISFET Qp.

First, the semiconductor substrate 1 is inserted into the chamber of the single-wafer-RTP apparatus and is placed on the stage. Thereafter, the temperature of the semiconductor substrate 1 is increased to approximately 500° C. by using the open-loop control in which the revolution speed of the semiconductor substrate 1 is set at 100 rpm. At the time when the temperature of the semiconductor substrate 1 reaches approximately 500° C., the revolution speed of the semiconductor substrate 1 is set to 240 rpm and, simultaneously, the open-loop control is switched to the closed-loop control. Then, the thermal treatment is performed to the semiconductor substrate 1 for a predetermined time at a temperature of 500° C. Thereafter, the temperature of the semiconductor substrate 1 is decreased and taken out from the chamber of the single-wafer RTP apparatus.

Figure 7:
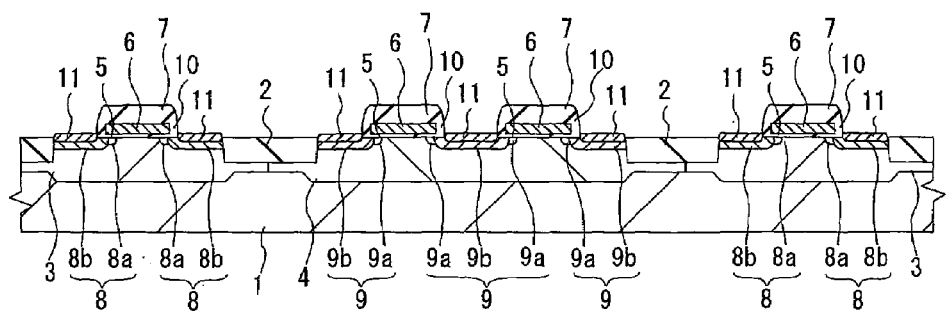
FIG. 7 is a sectional view showing a principal part of a semiconductor substrate, which illustrates, in step order, an example of a manufacturing method of a CMOS device according to the first embodiment of the present invention.

Next, as shown in FIG. 7, unreacted parts of the cobalt film 11a is removed and then the thermal treatment for obtaining low resistance of the silicide layer 11 is performed to the semiconductor substrate 1 by the use of the single-wafer RTP apparatus.

First, the semiconductor substrate 1 is inserted into the chamber of the single-wafer RTP apparatus and the temperature of the semiconductor substrate 1 is increased to approximately 500° C. by using the open-loop control in which the revolution speed of the semiconductor substrate 1 is set to 100 rpm. At the time when the temperature of the semiconductor substrate 1 reaches approximately 500° C., the revolution speed of the semiconductor substrate 1 is set to 240 rpm and, simultaneously, the open-loop control is switched to the closed-loop control to further increase the temperature of the semiconductor substrate 1 up to 800° C. Then, the thermal treatment is performed to the semiconductor substrate 1 for a predetermined time at a temperature of 800° C. Thereafter, the temperature of the semiconductor substrate 1 is decreased and taken out from the chamber of the single-wafer RTP apparatus.

Figure 8:
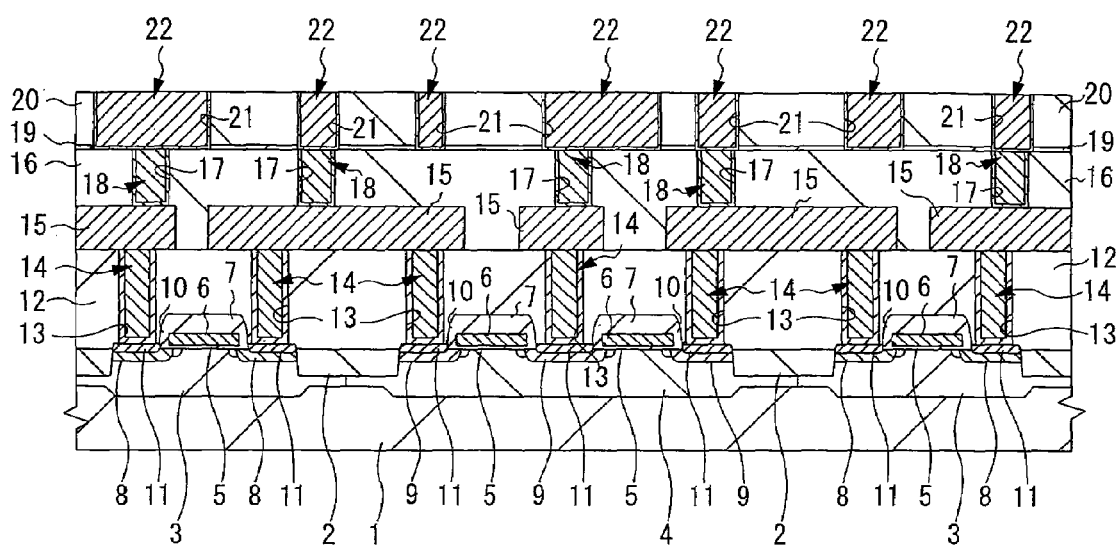
FIG. 8 is a sectional view showing a principal part of a semiconductor substrate, which-illustrates, in step order, an example of a manufacturing method of a CMOS device according to the first embodiment of the present invention.

Next, as shown in FIG. 8, after a silicon oxide film 12 is formed over the semiconductor substrate 1, the silicon oxide film 12 is polished by, for example, the CMP method to planarize the surface thereof. Subsequently, contact holes 13 are formed in the silicon oxide film 12 by the etching with using a resist pattern as a mask. This contact holes 13 are formed on necessary portions, for example, over the n type semiconductor region 8 and the p type semiconductor region 9, etc.

Subsequently, a titanium nitride film is formed on the entire surface of the semiconductor substrate 1 and inside the contact holes 13 by, for example, the CVD method, and a tungsten film to be buried in the contact holes 13 is formed by, for example, the CVD method. Thereafter, the titanium nitride film and the tungsten film in regions other than the insides of the contact holes 13 are removed by the CMP method. In this manner, plugs 14 each having the tungsten film as a main conductor film are formed in the contact holes 13.

Next, for example, after a tungsten film is formed over the semiconductor substrate 1, the tungsten film is processed by the etching with using a resist pattern as a mask to form wirings 15 constituting a first wiring layer. The tungsten film can be formed by, for example, the CVD or sputtering method.

Next, after an insulator, for example, a silicon oxide film covering the wirings 15 is formed, the insulator is polished by, for example, the CMP method to form an interlayer insulator 16 having a flat surface. Subsequently, contact holes 17 are formed in predetermined portions of the interlayer insulator 16 by the etching with using a resist pattern as a mask.

Subsequently, a barrier metal layer is formed over the entire surface of the semiconductor substrate 1 and inside the contact holes 17, and further a copper film to be buried in the contact holes 17 is formed. The barrier metal layer is made of, for example, a titanium nitride film, a tantalum film, or a tantalum nitride film, and is formed by, for example, the CVD or sputtering method. The copper film functions as a main conductor layer and can be formed by, for example, a plating method. Before the copper film is formed by the plating method, a thin copper film as a seed layer can be formed by the CVD or sputtering method. Thereafter, the copper film and the barrier metal layer in regions other than the insides of the contact holes 17 are removed by the CMP method to form plugs 18 in the contact holes 17.

Next, a stopper insulator 19 is formed over the semiconductor substrate 1, and further an insulator 20 for forming wirings is formed thereon. The stopper insulator 19 is made of, for example, a silicon nitride film, and the insulator 20 is made of, for example, a silicon oxide film. Wiring trenches 21 are formed in predetermined regions of the stopper insulator 19 and the insulator 20 by the etching with using a resist pattern as a mask.

Subsequently, a barrier metal layer is formed over the entire surface of the semiconductor substrate 1 and inside the wiring trenches 21, and further a copper film to be buried in the wiring trenches 21 is formed. Thereafter, the copper film and the barrier metal film in regions other than the insides of the wiring trenches 21 are removed by the CMP method to form, in the wiring trenches 21, wirings 22 constituting a second wiring layer as a main conductor layer of a copper film. The fabrication of the CMOS device is almost completed by forming some upper-layer wirings thereon. However, the illustration and description thereof are omitted here.

Note that the case where the present invention is applied to the thermal oxidation treatment or the thermal treatment in an certain fabrication step of the CMOS device has been described in the first embodiment. However, the present invention can be applied to other semiconductor-device manufacturing methods performing the thermal treatment to the semiconductor wafer by using a single-wafer apparatus provided with a wafer rotation mechanism, and the same effects are achieved also by such other methods.

As described above, according to the first embodiment, even if the in-plane temperature of the semiconductor wafer becomes nonuniform and the bowing of the semiconductor wafer occurs during the temperature rising process using the open-loop control in which the temperature of the semiconductor wafer is 500° C. or lower, it is possible to prevent the semiconductor wafer from dropping from the stage by relatively reducing the revolution speed of the semiconductor wafer to, for example, 100 rpm or smaller and by reducing the centrifugal force exerted on the semiconductor wafer. Additionally, the closed-loop control is used and further the revolution speed of the semiconductor wafer is relatively increased in the temperature rising process in which the temperature of the semiconductor wafer is higher than 500° C. and in the main treatment process. By so doing, the almost uniform in-plane temperature of the semiconductor wafer can be achieved. Therefore, the bowing of the semiconductor wafer can be prevented.

(Second Embodiment)

Figure 9:
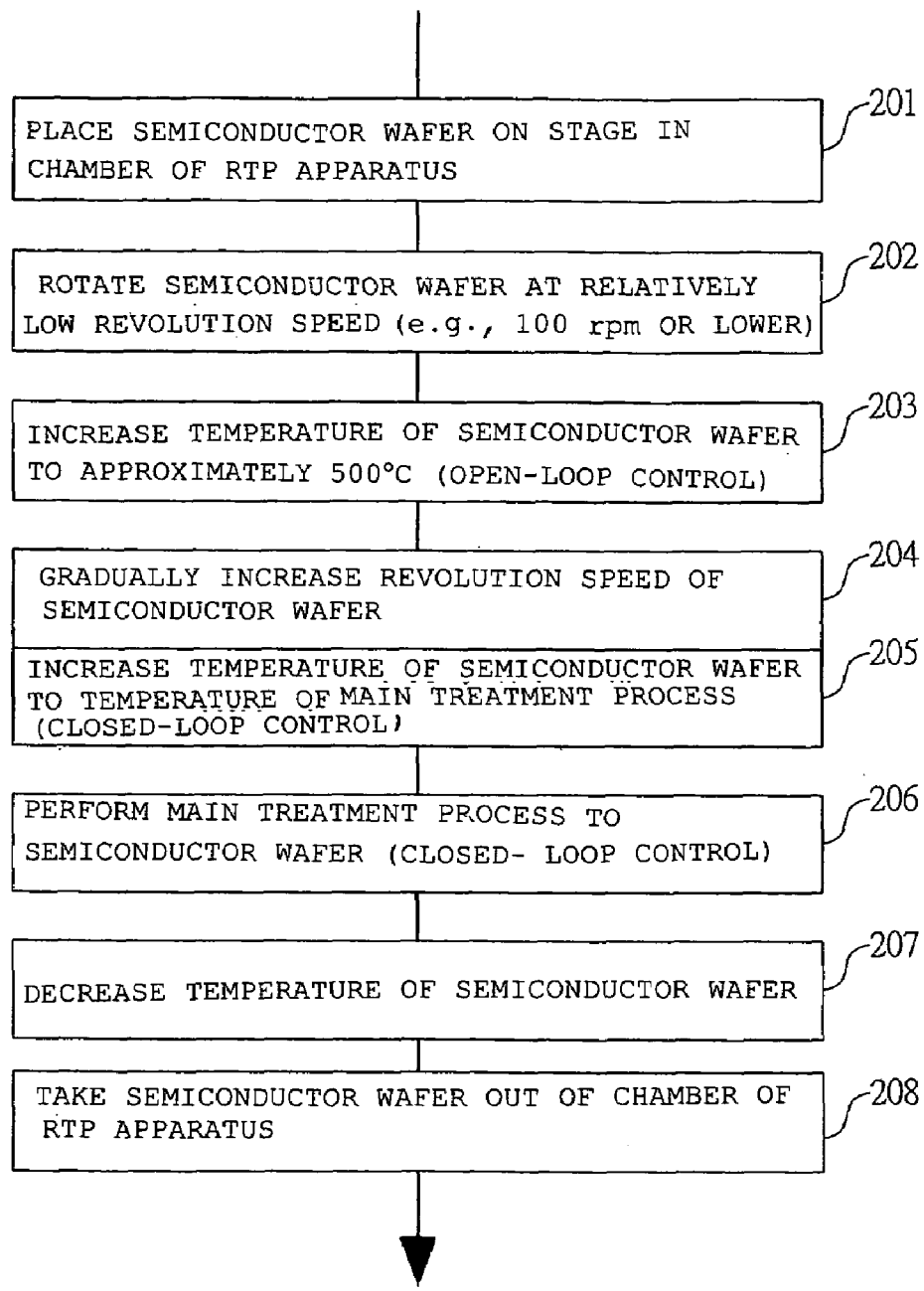
FIG. 9 is a flow diagram showing a thermal treatment process using a single-wafer RTP apparatus according to a second embodiment of the present invention.

The method of a thermal treatment using a single-wafer RTP apparatus according to a second embodiment will be described with reference to FIGS. 9 and 10. FIG. 9 is a flow diagram showing a thermal treatment process and FIG. 10 is a graph showing a time-change in temperature and revolution speed of the semiconductor wafer during the thermal treatment.

First, the semiconductor wafer is inserted into the chamber of the single-wafer RTP apparatus and is placed on the stage (step 201 in FIG. 9), and then the semiconductor wafer is rotated at a relatively low revolution speed, for example, 100 rpm or lower (step 202 in FIG. 9). Next, the temperature of the semiconductor wafer is increased to approximately 500° C. by using the open-loop control, for example, at the temperature rising rate of approximately 25° C./sec (step 203 in FIG. 9 and "STEP 1" in FIG. 10). By lowing relatively the revolution speed of the semiconductor wafer, the centrifugal force exerted on the semiconductor wafer can be reduced even if the bowing of the semiconductor wafer occurs. Therefore, the semiconductor wafer can be prevented from dropping from the stage.

Figure 10:
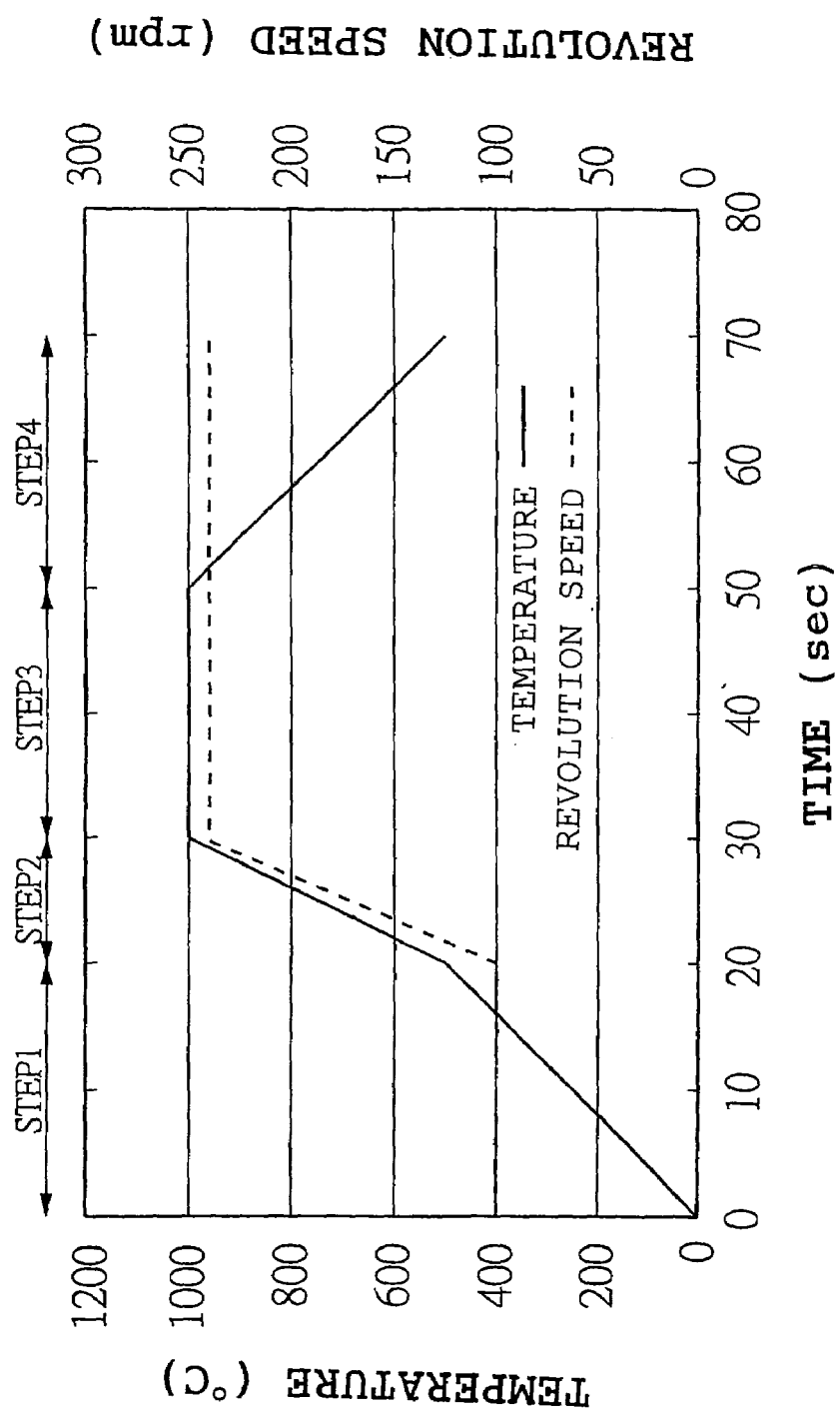
FIG. 10 is a graph showing a time-change in temperature and revolution speed of a semiconductor wafer during a thermal treatment according to the second embodiment of the present invention.

Next, at the time when the temperature of the semiconductor wafer reaches approximately 500° C., the revolution speed of the semiconductor wafer is gradually increased at a rate of, for example, approximately 25 rpm/sec (step 204 in FIG. 9) and, simultaneously, the open-loop control is switched to the closed-loop control to increase the temperature of the semiconductor wafer at a temperature rising rate of, for example, approximately 50° C./sec (step 205 in FIG. 9 and "STEP 2" in FIG. 10). By gradually increasing the revolution speed, an extreme change such as overshoot caused in the semiconductor wafer can be prevented. Subsequently, after the revolution speed of the semiconductor wafer reaches a predetermined value, for example, 240 rpm, the thermal treatment is performed to the semiconductor wafer for a predetermined time (step 206 in FIG. 9 and "STEP 3" in FIG. 10). Since the almost uniform in-plane temperature of the semiconductor wafer can be achieved by adopting the closed-loop control and making relatively high the revolution speed of the semiconductor wafer, it is possible to prevent the bowing of the semiconductor wafer.

Next, after a predetermined thermal treatment is performed to the semiconductor wafer, the lamp power of the halogen lamp is turned off while the semiconductor wafer is being rotated at a rotation speed of 200 to 300 rpm, and the temperature of the semiconductor wafer is decreased (step 207 in FIG. 9 and "STEP 4" in FIG. 10). When the temperature of the semiconductor wafer reaches, for example, approximately 150 to 200° C., the rotation of the semiconductor wafer is stopped and the semiconductor wafer is taken out of the chamber of the single-wafer RTP apparatus (step 208 in FIG. 9).

As described above, according to the second embodiment, it is possible to prevent the extreme change caused in the semiconductor wafer, by gradually increasing the revolution speed in the temperature rising process in which the temperature of the semiconductor wafer is higher than 500° C.

(Third Embodiment)

Figure 11:
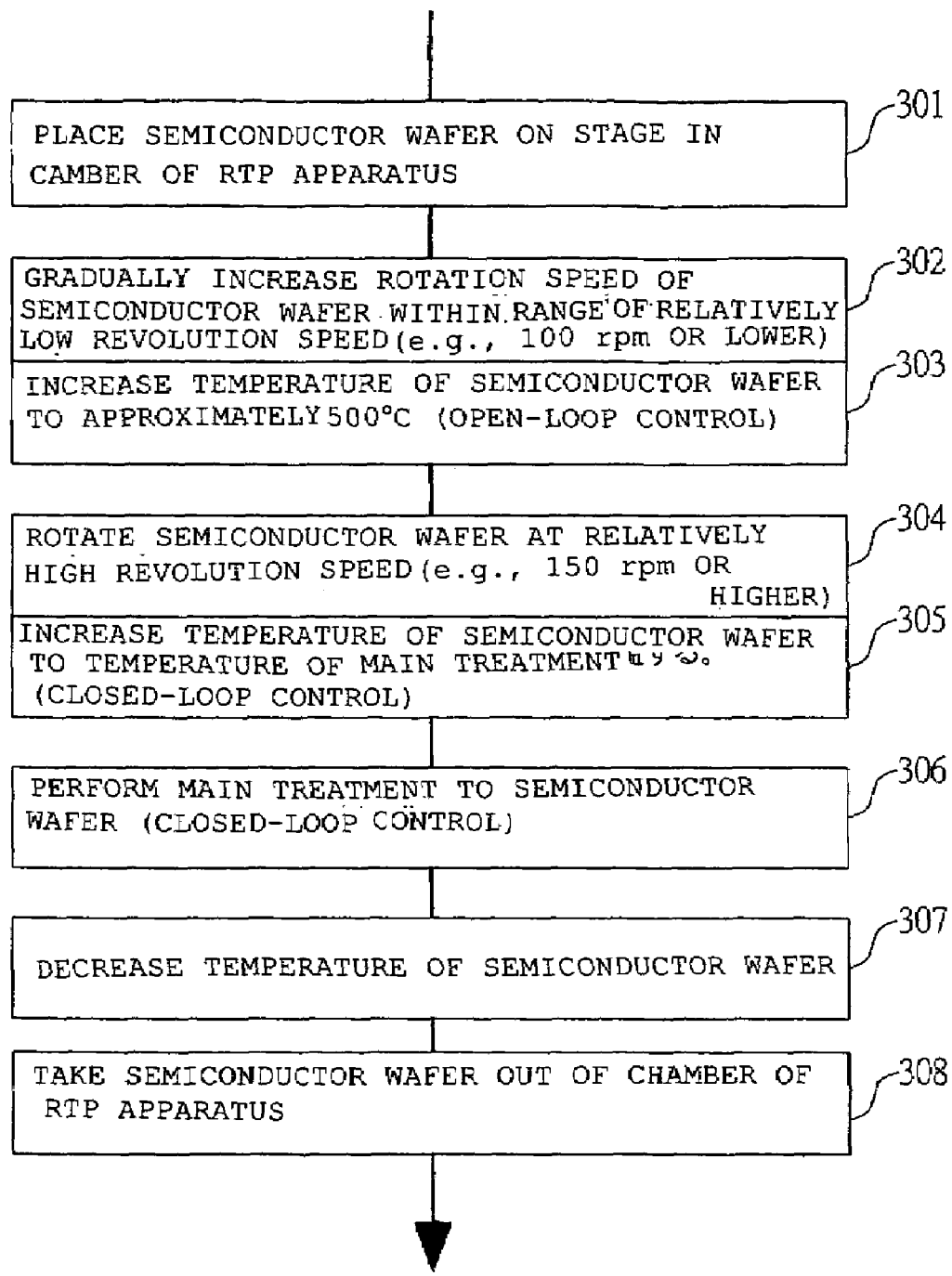
FIG. 11 is a flow diagram showing a thermal treatment process using a single-wafer RTP apparatus according to a third embodiment of the present invention.

A method of a thermal treatment using a single-wafer RTP apparatus according to a third embodiment will be described with reference to FIGS. 11 and 12. FIG. 11 is a flow diagram showing a thermal treatment process and FIG. 12 is a graph showing a time-change in temperature and revolution speed of the semiconductor wafer during the thermal treatment.

First, the semiconductor wafer is inserted into the chamber of the single-wafer RTP apparatus and is placed on the stage (step 301 in FIG. 11). Thereafter, while the revolution speed of the semiconductor wafer is gradually increased at a rate of, for example, approximately 5 rpm/sec (step 302 in FIG. 11), the temperature of the semiconductor wafer is increased to approximately 500° C. by using the open-loop control, at a temperature rising rate of approximately 25° C./sec (step 303 in FIG. 11 and "STEP 1" in FIG. 12). By gradually increasing the revolution speed of the semiconductor wafer, the centrifugal force exerted on the semiconductor wafer can be further reduced. Therefore, it is possible to prevent the semiconductor wafer from dropping from the stage. Note that the revolution speed of the semiconductor wafer is set to 100 rpm or smaller in a process using the open-loop control in which the temperature of the semiconductor wafer is 500° C. or lower.

Next, at the time when the temperature of the semiconductor wafer reaches approximately 500° C., the revolution speed of the semiconductor wafer is changed to, for example, approximately 150 rpm (step 304 in FIG. 11) and, simultaneously, the open-loop control is switched to the closed-loop control to increase the temperature of the semiconductor wafer at a temperature rising rate of, for example, approximately 50° C./sec (step 305 in FIG. 11 and "STEP 2" in FIG: 12). Subsequently, the thermal treatment is performed to the semiconductor wafer for a predetermined time (step 306 in FIG. 11 and "STEP 3" in FIG. 12). Since the almost uniform in-plane temperature of the semiconductor wafer can be achieved by adopting the closed-loop control and making relatively high the revolution speed of the semiconductor wafer, it is possible to prevent the bowing of the semiconductor wafer.

Figure 12:
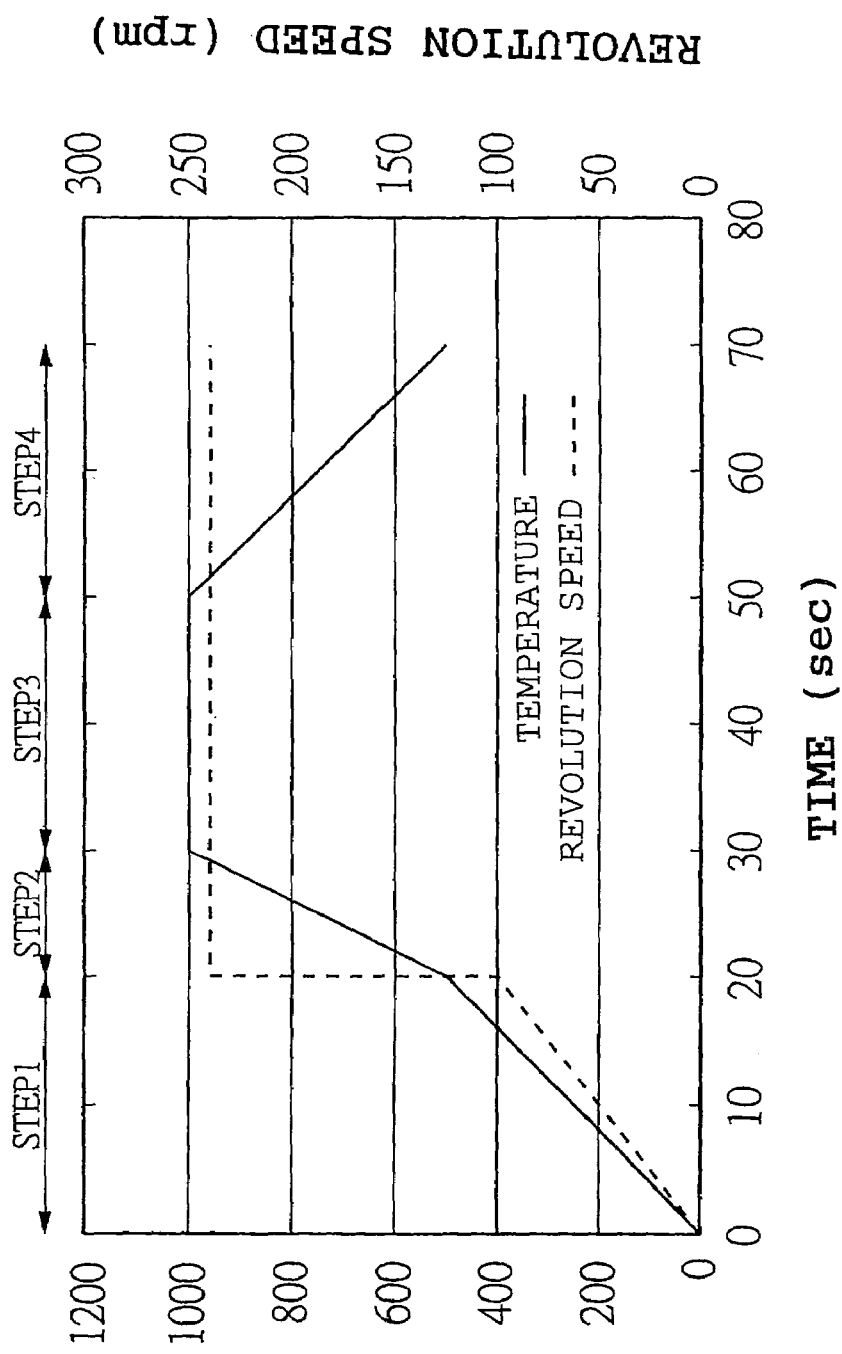
FIG. 12 is a graph showing a time-change in temperature and revolution speed of a semiconductor wafer during a thermal treatment according to the third embodiment of the present invention.

Next, after a predetermined thermal treatment is performed to the semiconductor wafer, while the semiconductor wafer is being rotated at the revolution speed of 200 to 300 rpm, the lamp power of the halogen lamp is turned off and the temperature of the semiconductor wafer is decreased (step 307 in FIG. 11 and "STEP 4" in FIG. 12). When the temperature of the semiconductor wafer is reaches, for example, approximately 150 to 200° C., the rotation of the semiconductor wafer is stopped and the semiconductor wafer is taken out of the chamber of the single-wafer RTP apparatus (step 308 in FIG. 11).

As described above, according to the third embodiment, in the temperature rising process in which the temperature of the semiconductor wafer is 500° C. or lower, by gradually increasing the revolution speed of the semiconductor wafer, it is possible to further reduce the centrifugal force exerted on the semiconductor wafer and to prevent the semiconductor wafer from dropping from the stage.

(Fourth Embodiment)

Figure 13:
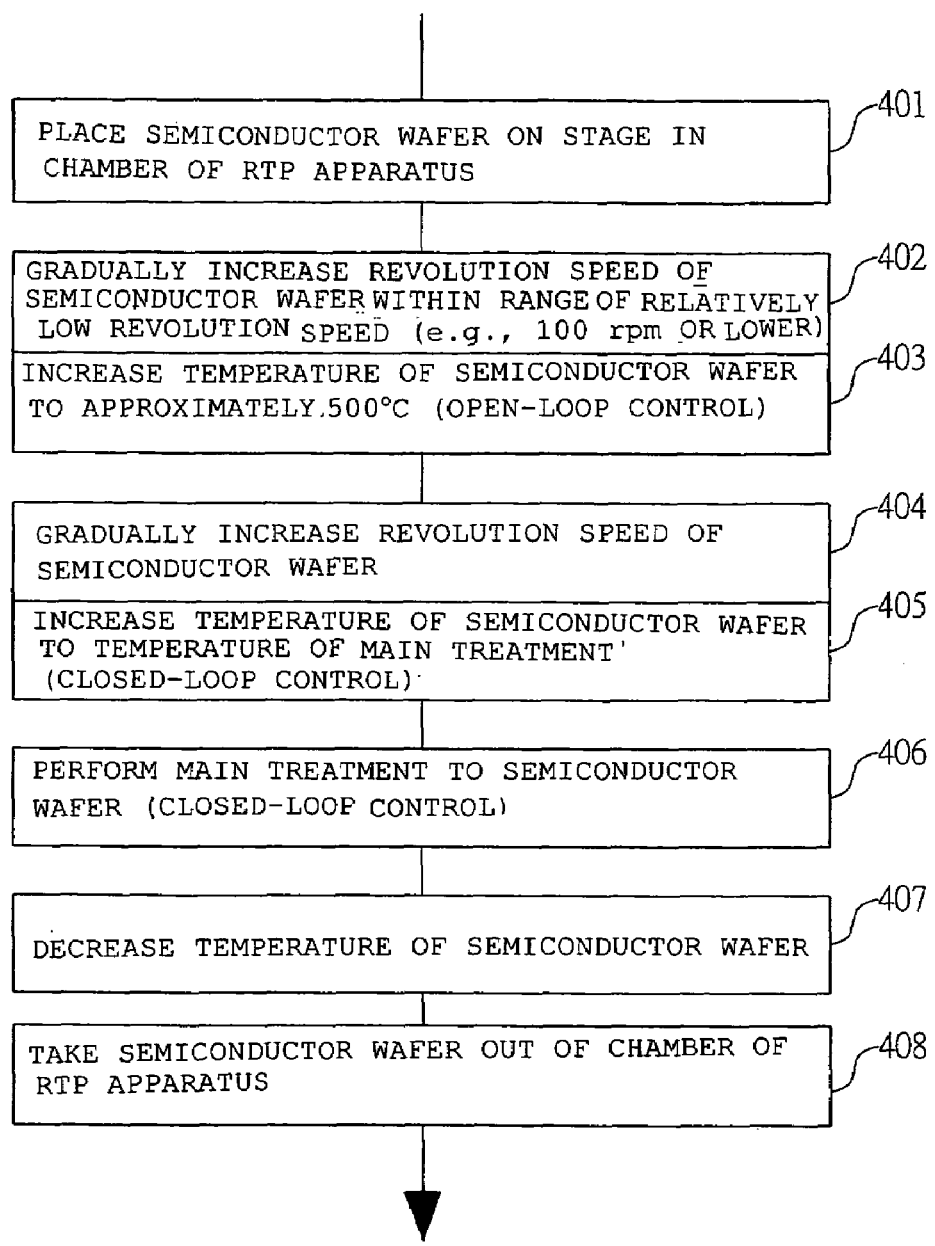
FIG. 13 is a flow diagram showing a thermal treatment process using a single-wafer RTP apparatus according to a fourth embodiment of the present invention.

A method of a thermal treatment using a single-wafer RTP apparatus according to a fourth embodiment will be described with reference to FIGS. 13 and 14. FIG. 13 is a flow diagram showing a thermal treatment process and FIG. 14 is a graph showing a time-change in temperature and revolution speed of the semiconductor wafer during the thermal treatment.

First, the semiconductor wafer is inserted into the chamber of the single-wafer RTP apparatus and is placed on the stage (step 401 in FIG. 13). Thereafter, while the revolution speed of the semiconductor wafer is gradually increased at a rate of, for example, approximately 5 rpm/sec (step 402 in FIG. 13), the temperature of the semiconductor wafer is increased up to approximately 500° C. by using the open-loop control, at a temperature rising rate of approximately 25° C./sec (step 403 in FIG. 13 and "STEP 1" in FIG. 14).

Figure 14:
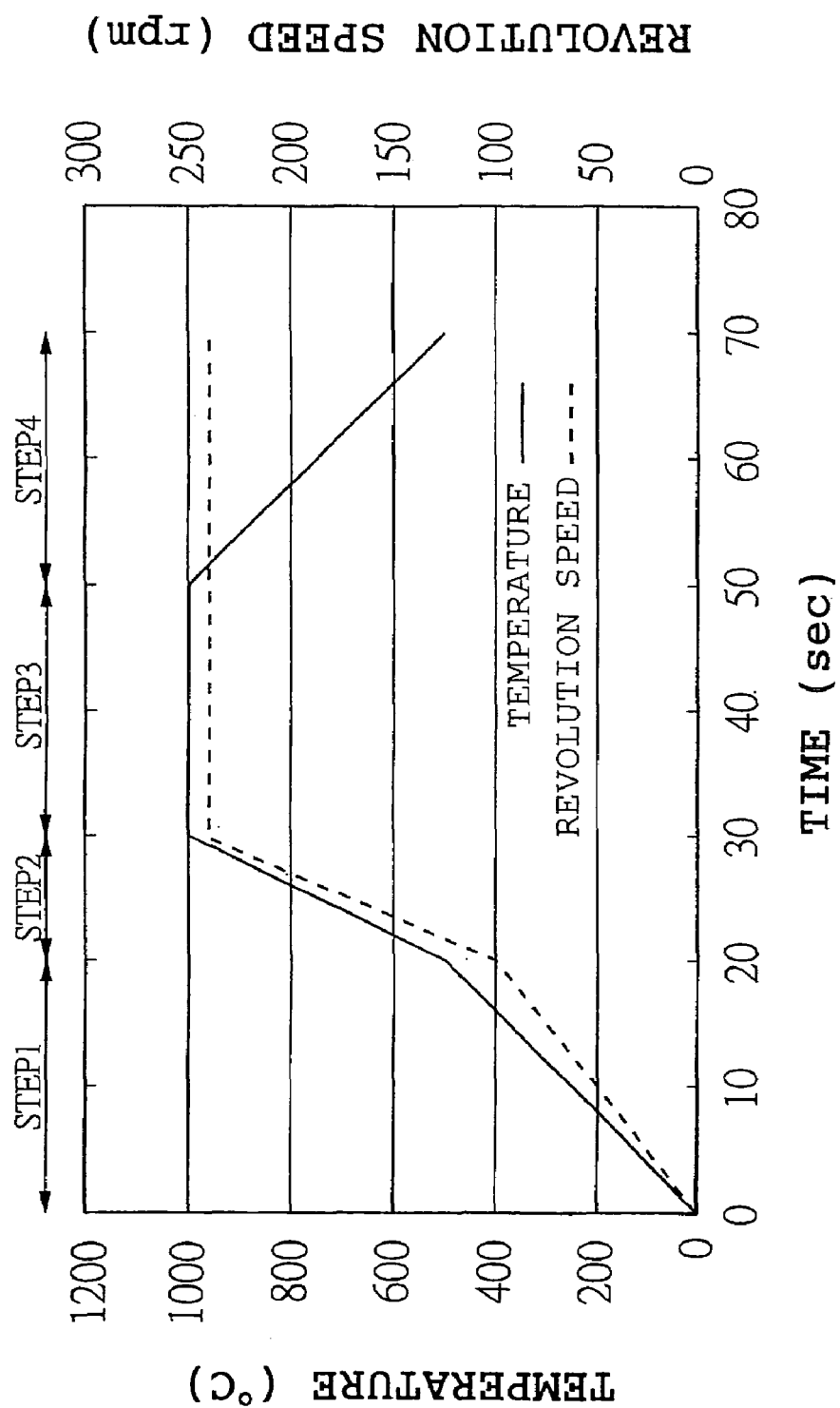
FIG. 14 is a graph showing a time-change in temperature and revolution speed of a semiconductor wafer during a thermal treatment according to the fourth embodiment of the present invention.

Next, at the time when the temperature of the semiconductor wafer reaches 500° C., the revolution speed of the semiconductor wafer is gradually increased at a rate of, for example, approximately 25 rpm/sec (step 404 in FIG. 13) and, simultaneously, the open-loop control is switched to the closed-loop control to increase the temperature of the semiconductor wafer at a temperature rising rate of, for example, approximately 50° C./sec (step 405 in FIG. 13 and "STEP 2" in FIG. 14). Subsequently, after the revolution speed of the semiconductor wafer reaches a predetermined value, for example, 240 rpm, the thermal treatment is performed to the semiconductor wafer for a predetermined time (step 406 in FIG. 13 and "STEP 3" in FIG. 14). Since the almost uniform in-plane temperature of the semiconductor wafer can be achieved by adopting the closed-loop control and making relatively high the revolution speed of the semiconductor wafer. Therefore, it is possible to prevent the bowing of the semiconductor wafer.

Next, after a predetermined thermal treatment is performed to the semiconductor wafer, while the semiconductor wafer is being rotated at a revolution speed of 200 to 300 rpm, the lamp power of the halogen lamp is turned off and the temperature of the semiconductor wafer is decreased (step 407 in FIG. 13 and "STEP 4" in FIG. 14). When the temperature of the semiconductor wafer reaches, for example, approximately 150 to 200° C., the rotation of the semiconductor wafer is stopped and the semiconductor wafer is taken out of the chamber of the single-wafer RTP apparatus (step 408 in FIG. 13).

As described above, according to the fourth embodiment, in the temperature rising process in which the temperature of the semiconductor wafer is 500° C. or lower, by gradually increasing the revolution speed of the semiconductor wafer, it is possible to further reduce the centrifugal force exerted on the semiconductor wafer and to prevent the semiconductor wafer from dropping from the stage of the semiconductor wafer. Additionally, it is also possible to prevent the extreme change caused in the semiconductor wafer, by gradually increasing the revolution speed in the temperature rising process in which the temperature of the semiconductor wafer is higher than 500° C.

In the foregoing, the inventions made by the inventors have been concretely described based on the embodiments. However, needless to say, the present invention is not limited to the foregoing embodiments and can be variously modified and altered without departing from the gist thereof.

For example, the single-wafer RTP apparatus of the lamp-heating type using a halogen lamp has been described in the foregoing embodiments. However, it is also possible to apply the present invention to the single-wafer RTP apparatus of other heating types such as a laser-heating type, an electron-beam-heating type, and an ion-beam-heating type, and the equivalent effects can be achieved in any cases.

The effects obtained by the typical ones of the inventions disclosed in this application will be briefly described as follows.

In the temperature rising process using the open-loop control in which the semiconductor wafer has a temperature of 500° C. or lower, by making relatively low the revolution speed of the semiconductor wafer, that is, 100 rpm or lower, the centrifugal force exerted on the semiconductor wafer is reduced even if the bowing of the semiconductor wafer occurs. Therefore, it is possible to-prevent the semiconductor wafer from dropping from the stage of the single-wafer RTP apparatus and, as a result, prevent the breakage of the semiconductor wafer.

What is claimed is:

1. A method of manufacturing a semiconductor device, in which a thermal treatment, including a temperature rising process, a main treatment process in which a predetermined final temperature is maintained for a predetermined time, and a temperature falling process, is performed to a semiconductor wafer by using a single-wafer apparatus, the method comprising the steps of:
   making open-loop control in said temperature rising process in which the temperature of said semiconductor wafer is relatively low;
   making closed-loop control in said temperature rising process in which the temperature of said semiconductor wafer is relatively high and in said main treatment process;
   rotating said semiconductor wafer at a relatively low revolution speed in a process for making said open-loop control; and
   rotating said semiconductor wafer at a relatively high revolution speed in a process for making said closed-loop control.

2. The method of manufacturing a semiconductor device according to claim 1,
   wherein said-semiconductor wafer is rotated at a constant first revolution speed in the process for making said open-loop control, and said semiconductor wafer is rotated at a constant second revolution speed different from said first revolution speed in the process for making said closed-loop control.

3. The method of manufacturing a semiconductor device according to claim 2,
   wherein when said semiconductor wafer has a diameter of 200 mm or smaller, the revolution speed of said semiconductor wafer is 100 rpm or lower in the process for making said open-loop control, and is in a range of 150 to 250 rpm in the process for making said closed-loop control.

4. The method of manufacturing a semiconductor device according to claim 2,
   wherein when said semiconductor wafer has a diameter of 300 mm or larger, the revolution speed of said semiconductor wafer is 100 rpm or lower in the process for making said open-loop control, and is in a range of 200 to 300 rpm in the process for making said closed-loop control.

5. The method of manufacturing a semiconductor device according to claim 1,
   wherein said semiconductor wafer is rotated at a constant revolution speed in the process for making said open-loop control, and is rotated at a gradually increased revolution speed in the process for making said closed-loop control.

6. The method of manufacturing a semiconductor device according to claim 1,
wherein said semiconductor wafer is rotated at a gradually increased revolution speed in the process for making said open-loop control, and is rotated at a constant revolution speed in the process for making said closed-loop control.

7. The method of manufacturing a semiconductor device according to claim 1,
wherein said semiconductor wafer is rotated at a gradually increased revolution speed in each of the processes for making said open-loop control and said closed-loop control.

8. A method of manufacturing a semiconductor device, in which a thermal treatment, including a treatment rising process, a main treatment process in which a predetermined final temperature is maintained for a predetermined time, and a temperature falling process, is performed to a semiconductor wafer by using a single-wafer apparatus, the method comprising the steps of:
rotating said semiconductor wafer at a relatively low revolution speed in said temperature rising process in which the temperature of said semiconductor wafer is 500° C. or lower; and
rotating said semiconductor wafer at a relatively high revolution speed in said temperature rising process in which the temperature of said semiconductor wafer is higher than 500° C. and in said main treatment process.

9. The method of manufacturing a semiconductor device according to claim 8,
wherein said semiconductor wafer is rotated at a constant first revolution speed in said treatment rising process in which the temperature of said semiconductor wafer is 500° C. or lower, and is rotated at a constant second revolution speed different from said first revolution speed in said temperature rising process in which the temperature of said semiconductor wafer is higher than 500° C. and in said main treatment process.

10. The method of manufacturing a semiconductor device according to claim 9,
wherein when said semiconductor wafer has a diameter of 200 mm or smaller, the revolution speed of said semiconductor wafer is 100 rpm or lower in said temperature rising process in which the temperature of said semiconductor wafer is 500° C. or lower, and is within a range of 150 to 250 rpm in said temperature rising process in which the temperature of said semiconductor wafer is higher than 500° C. and in said main treatment process.

11. The method of manufacturing a semiconductor device according to claim 9,
wherein when said semiconductor wafer has a diameter of 300 mm or larger, the revolution speed of said semiconductor wafer is 100 rpm or lower in said treatment rising process in which the temperature of said semiconductor wafer is 500° C. or lower, and is within a range of 200 to 300 rpm in said temperature rising process in which the temperature of said semiconductor wafer is higher than 500° C. and in said main treatment process.

12. The method of manufacturing a semiconductor device according to claim 8,
wherein said semiconductor wafer is rotated at a constant revolution speed in said temperature rising process in which the temperature of said semiconductor wafer is 500° C. or lower, and is rotated at a gradually increased revolution speed in said temperature rising process in which the temperature of said semiconductor wafer is higher than 500° C. and in said main treatment process.

13. The method of manufacturing a semiconductor device according to claim 12,
wherein when said semiconductor wafer has a diameter of 300 mm or larger, said semiconductor wafer is rotated at a constant revolution speed within a range of 100 rpm or lower in said treatment rising process in which the temperature of said semiconductor wafer is 500° C. or lower, and is rotated at a gradually increased revolution speed from 100 rpm or lower to a range of 200–300 rpm in said temperature rising process in which the temperature of said semiconductor wafer is higher than 500° C. and in said main treatment process.

14. The method of manufacturing a semiconductor device according to claim 8,
wherein said semiconductor wafer is rotated at a gradually increased revolution speed in said temperature rising process in which the temperature of said semiconductor wafer is 500° C. or lower, and is rotated at a constant revolution speed in said temperature rising process in which the temperature of said semiconductor wafer is higher than 500° C. and in said main treatment process.

15. The method of manufacturing a semiconductor device according to claim 14,
wherein when said semiconductor wafer has a diameter of 300 mm or larger, said semiconductor wafer is rotated at a generally increased revolution speed within a range of 100 rpm or lower in said treatment rising process in which the temperature of said semiconductor wafer is 500° C. or lower, and is rotated at a constant revolution speed within a range of 200 to 300 rpm in said temperature rising process in which the temperature of said semiconductor wafer is higher than 500° C. and in said main treatment process.

16. The method of manufacturing a semiconductor device according to claim 8,
wherein said semiconductor wafer is rotated at a gradually increased revolution speed in said temperature rising process in which the temperature of said semiconductor wafer is 500° C. or lower, in said temperature rising process in which the temperature of said semiconductor wafer is higher than 500° C., and in said main treatment process.

17. The method of manufacturing a semiconductor device according to claim 16,
wherein when said semiconductor wafer has a diameter of 300 mm or larger, said semiconductor wafer is rotated at a generally increased revolution speed within a range of 100 rpm or lower in said treatment rising process in which the temperature of said semiconductor wafer is 500° C. or lower, and is rotated at a gradually increased revolution speed from 100 rpm or lower to a range of 200–300 rpm in said temperature rising process in which the temperature of said semiconductor wafer is higher than 500° C. and in said main treatment process.

* * * * *